United States Patent [19]

Yunogami et al.

[11] Patent Number: 5,241,186
[45] Date of Patent: Aug. 31, 1993

[54] SURFACE TREATMENT METHOD AND APPARATUS THEREFOR

[75] Inventors: Takashi Yunogami, Kokubunji; Tatsumi Mizutani, Koganei; Keizo Suzuki, Kodaira, all of Japan

[73] Assignee: Hitachi, Ltd., Chiyoda, Japan

[21] Appl. No.: 552,119

[22] Filed: Jul. 13, 1990

[30] Foreign Application Priority Data

Jul. 14, 1989 [JP] Japan .................. 1-180321

[51] Int. Cl.[5] ........................... G01N 23/225
[52] U.S. Cl. .................. 250/492.3; 250/306; 250/307; 250/310; 250/442.2
[58] Field of Search ............ 250/492.3, 307, 309, 250/310, 398, 306, 492.2; 204/298.36

[56] References Cited

U.S. PATENT DOCUMENTS

| | | | |
|---|---|---|---|
| 3,497,775 | 2/1970 | Ono | 317/235 |
| 4,088,799 | 5/1978 | Kurtin | 437/17 |
| 4,116,721 | 9/1978 | Ning et al. | 437/17 |
| 4,795,529 | 1/1989 | Kawasaki | 204/298.36 |
| 4,851,668 | 7/1989 | Ohno et al. | 250/492.3 |
| 4,956,043 | 9/1990 | Kanetomo et al. | 204/298.36 |
| 4,957,602 | 9/1990 | Binder et al. | 250/492.3 |
| 4,976,843 | 12/1990 | Ward et al. | 250/492.3 |
| 4,992,661 | 2/1991 | Tamura et al. | 250/307 |

FOREIGN PATENT DOCUMENTS

0002421  6/1979  European Pat. Off.

OTHER PUBLICATIONS

Applied Physics Letters, vol. 36, No. 1 Jan. 1980 pp. 81-84; Ma et al.
IBM Technical Disclosure Bulletin, vol. 26, No. 9, Feb. 1984 pp. 4832-4833, Pak et al.

Primary Examiner—Paul M. Dzierzynski
Assistant Examiner—Kiet T. Nguyen
Attorney, Agent, or Firm—Antonelli, Terry, Stout & Kraus

[57] ABSTRACT

A method of preventing damages of a semiconductor having an insulator film at its surface caused by holes induced in the insulator film and move to and are trapped at or near the interface between the insulator film and a substrate upon applying surface treatment for the surface of the semiconductor, as well as an apparatus suitable to practicing the method are disclosed. The surface treatment method comprises trapping to eliminate the holes in the insulator film by an electric field before the movement of the holes at or near the interface, neutralizing the induced holes by re-combination, or previously forming a hole trapping level in the insulator film thereby trapping the induced holes to the trapping level, etc.

68 Claims, 6 Drawing Sheets

SURFACE TREATMENT METHOD AND APPARATUS THEREFOR

BACKGROUND OF THE INVENTION

The present invention concerns a surface treatment technology for semiconductors and, in particular, it relates to a surface treatment method suitable to elimination of damage induced in an insulator film present at the surface of a semiconductor device, as well as an apparatus for practicing such a method.

In the surface treatment of a semiconductor by using high energy particles generated, for example, in plasmas, it has been known that various types of damage are caused in the insulator film of the semiconductor device due to such high energy particles irradiated to the semiconductor. For eliminating such damage, a method of annealing the semiconductor after surface treatment has been adopted.

Damage to the insulator film is mainly caused by holes induced in the insulator film due to various particles irradiated to a specimen for conducting the surface treatment. The various particles means those elementary particles such as ions, neutrals, electrons, photons or mesons. The holes are induced near the surface of the insulator film. When the holes, after thus induced, move through the insulator film and are trapped at or near the interface between the insulator film and the substrate, this causes changes (damage) in the device characteristics of semiconductor such as the threshold voltage shift, dielectric breakdown, decline in life time for minority carriers, etc.

That is, when the holes are trapped at or near the interface, the trapped holes generate near interface states or interface states, or holes trapped at or near the interface are recombined with thermally excited electrons from the substrate to generate photons, which break the bonds of the crystal lattice at or near the interface to newly generate near interface states or interface states. It is considered that the characteristic degradation as described above is caused by such mechanisms. Accordingly, this damage caused by the holes can not be eliminated completely by merely annealing the semiconductor device after the surface treatment.

That is, if the holes induced in the insulator film in the process of the surface treatment are trapped at or near the interface between the insulator film and the substrate, this may cause damage. However, since the conventional surface treatment method and surface treatment apparatus are not adapted to inhibit the holes induced in the insulator film from being trapped at or near the interface between the insulator film and the substrate, it can not be effectively suppress the occurrence of the damage as described above.

SUMMARY OF THE INVENTION

The object of the present invention is to provide a surface treatment method and a surface treatment apparatus capable of avoiding that holes induced in the insulator film in the course of the surface treatment from being trapped at or near the interface between the insulator film and the substrate.

For attaining the foregoing object, there are the following three methods of:

(I) eliminating the induced holes from the insulator film before they are trapped at or near the interface between the insulator film and the substrate, (II) recombining the induced holes with electrons thereby neutralizing them in the insulator film at a distance from the interface before the holes are trapped at or near the interface between the insulator film and a substrate, or (III) previously forming a hole trap in the insulator film at a distance from the interface between the insulator film and the substrate and trapping the induced holes in the trap.

For practicing these methods, a function of preventing the induced holes from being trapped at or near the interface can further be improved by previously cooling a semiconductor specimen to be applied with surface treatment in a series of processes for the surface treatment of the semiconductor including the process of practicing such a method.

The method (I) described above can be practiced by applying a voltage such that the potential at the surface of the insulator film on the side irradiated with various particles used for the surface treatment (hereinafter referred to as a surface) is lower than (that is, potential on the negative side) the potential of the surface of the insulator film on the opposite side, that is, on the side of the substrate (hereinafter referred to as an interface).

For applying such a voltage, there may be employed, for example, a method of forming a layer of a conductive material to the surface of the insulator film by means of coating or other appropriate means and applying a negative voltage to the substrate by using the layer as the electrode or a method of depositing particles charged negatively to the surface of the insulator film. As the conductive material used for forming the layer in the former method, there can be used such a material, for example, as containing a conductive polymer. Further, as negatively charged particles to be deposited on the surface of the insulator film in the latter method, negative ions such as oxygen ions, nitrogen ions and halogen-containing ions can be used.

The method (II) described above can be practiced by injecting electrons at a low energy from the outside of the surface of the insulator film into the neighborhood of the surface of the insulator film, after the holes are induced near the surface of the insulator film by the application of the surface treatment and before the holes move near the interface between the insulator film and the substrate, that is, while the induced holes are still present near the surface of the insulator film. That is, the injected electrons recombine the induced holes to neutralize the holes.

For injecting electrons at low energy into the insulator film there can be used, for example, a method of bringing a material charged to a high negative voltage closer to the surface of an insulator film from the outside thereof, causing corona discharge between the electrified material and the surface of the insulator film and injecting electrons generated thereby into the insulator film, a method of disposing material that generates photoelectrons upon irradiation of photons above the surface of the insulator film, irradiating photons thereto thereby generating photoelectrons and injecting the photoelectrons into the insulator film, or a method of causing static electricity to the surface of the insulator and injecting electrons generated there into the insulator film.

For practicing the method (III) described above, there can be used a method of previously implanting low energy particles, for example, ions with kinetic energy lower than 1 keV or neutral atoms (or neutral molecules) with kinetic energy lower than 10 keV to the extreme vicinity of the surface of the insulator film before applying a semiconductor surface treatment as bringing about the induction of holes thereby forming the trapping center for the holes near the surface of the insulator film. As the low energy ions implanted near the surface of the insulator film, oxygen ions, nitrogen ions, helium ions or neon ions can be used. Similarly, as the low energy neutral atoms (or neutral molecules) implanted near the surface of the insulator film, there can be used oxygen atoms, nitrogen atoms, mixture of these atoms (or oxygen molecules, nitrogen molecules or mixed molecules of them) can be used.

For the insulator film as the object to be treated in the present invention, there can be mentioned Si oxide film, Si nitride film or Ta oxide film usually used for the formation of semiconductor devices but there is no particular restriction only thereto and any other optional insulator films may be used.

For practicing the method (I) described above, when a conductive material film is formed to the surface of an insulator film as a negative electrode or negatively charged particles are deposited to the surface of the insulator film and the portion of the surface deposited with the negatively charged particles is used as a negative electrode and a voltage is applied between such a negative electrode and the side of the substrate as a positive electrode, since holes induced in the insulator film have positive charges, they move toward the negative electrode, that is, in the direction of the surface of the insulator film. Then, the holes moved to the surface of the insulator film are finally eliminated out of the insulator film and recombined with the electrons in the negative electrode to be neutralized.

For practicing the method (II) described above, when electrons are injected into the insulator film by using a method, for example, of bringing a material charged to a high negative voltage closer to the surface of the insulator film from the outside thereof, causing corona discharge between the charged material and the surface of the insulator film and injecting electrons generated thereby into the insulator film, or disposing material that generates photoelectrons upon irradiation of photons above the surface of the insulator film and irradiating photons to the material to generate photoelectrons which are then injected or irradiated into the insulator film, or further, causing static electricity to the surface of the insulator film and injecting electrons generated thereby into the insulator film, holes induced in the insulator film are recombined and neutralized with the injected electrons.

Upon causing the corona discharge described above, if an oxygen gas is introduced at least as a portion of the gas introduced into the processing vacuum chamber to render the inside of the processing vacuum chamber as an oxygen atmosphere, since ultraviolet rays (photons) or vacuum ultraviolet rays (photons) generated by the corona discharge are absorbed by oxygen, there is no worry that the specimen is damaged due to the corona discharge. Instead of the oxygen gas, other gases may also be induced so long as they absorb ultraviolet or vacuum ultraviolet rays.

As the material for generating photoelectrons, there can be mentioned those compound semiconductors such as Ag-O-Cs, Ga-As, Ga-Cs, In-Ga-As, Sb-Cs, Sb-Rb-Cs, Cs-Te, Cs-I, etc. in view of the reason, for example, that they have good efficiency for generating photoelectrons, can produce photoelectrons with photons in a wavelength region from visible rays to ultraviolet rays.

For practicing the method (III) described above, when hole trapping centers are formed by previously implanting low energy particles (charged particles at low energy of lower than 1 keV or lower energy neutral atoms or neutral molecules of lower than 10 keV) in the insulator film apart from the interface between the insulator film and substrate before the surface treatment, holes induced in the insulator film are trapped to the hole trapping centers before they are trapped at or near the interface between the insulator film and the substrate. The implanted charged particles are defined herein as less than 1 keV, so that no damage may be formed in the insulator film by the ion implantation per se, for example, in a case where implanted charged particles are ions. On the other hand, in a case where the implanted particles are neutral atoms or molecules not having electric charges, since the amount of the radiation damage is smaller as compared with case of the ions at an identical energy, the upper limit of the energy can be increased to 10 keV.

Upon practicing the methods (I) (III), when the semiconductor specimen to be applied with the surface treatment is previously cooled in the series of surface treatment processes, including the process of practicing the method, since the hole mobility is abruptly reduced along with the lowering of the temperature, holes induced in the insulator film do not move instantly due to diffusion from the place where they are induced (that is in the vicinity of the surface) to the place at or near the interface relative to the substrate. Accordingly, if a voltage is applied in accordance with the method (I) or electrons are injected in accordance with the method (II) above in this state, trapping of the holes near or at the interface between the insulator film and the substrate can be prevented completely. Further, since the thermal kinetic energy of the hole is extremely small in a state cooled to the low temperature as described above, the holes are easily trapped by the hole trapping level formed in the insulator film in accordance with the method (III).

The standard for the cooling temperature of the specimen can be determined as explained below. That is, the moving velocity of the holes is reduced by cooling and, briefly speaking, it is necessary that the holes induced in the insulator film do not move as far as near or at the interface between the insulator film and the substrate before practicing the method of eliminating or neutralizing the holes. Accordingly, the specimen may be cooled so as to obtain such a hole mobility as capable of satisfying the relationship:

$$T_1 > T_2 \qquad (1)$$

in which $T_1$ represents a period of time required for holes from their induction in the insulator film till reaching near or at the interface between the insulator film and the substrate by the movement through the insulator film, and $T_2$ represents a period of time required from the induction of the holes in the insulator film till the conduction of any one of the methods as described above for eliminating the holes out of the insulator film or neutralizing.

$T_2$ is about several tens of seconds in the usual surface treatment process. Assuming for example, that an $SiO_2$ film of 100 nm film thickness is used as an insulator film and that the holes move only by the diffusion, $T_1$ is about $10^2$ seconds at a cooling temperature of lower than 200° K., by which the conditions for the equation (1) above can be satisfied sufficiently.

Further, there is a possibility that the surface of the insulator film is charged up to about +10 V under the effect of irradiated particles upon surface treatment. In such a case, since the induced holes drift in the direction of the interface between the insulator film and the substrate due to the charge-up potential, $T_1$ is decreased. However, if the cooling temperature is lowered to less than 150° K., $T_1$ can be kept more than 102 sec also in this case.

DESCRIPTION OF PREFERRED EMBODIMENTS

The present invention will now be described by way of various embodiments with reference to the accompanying drawings.

EXAMPLE 1

The present invention will be described at first by way of its preferred embodiment while referring to FIGS. 1, 2 and 3.

Figure 1:
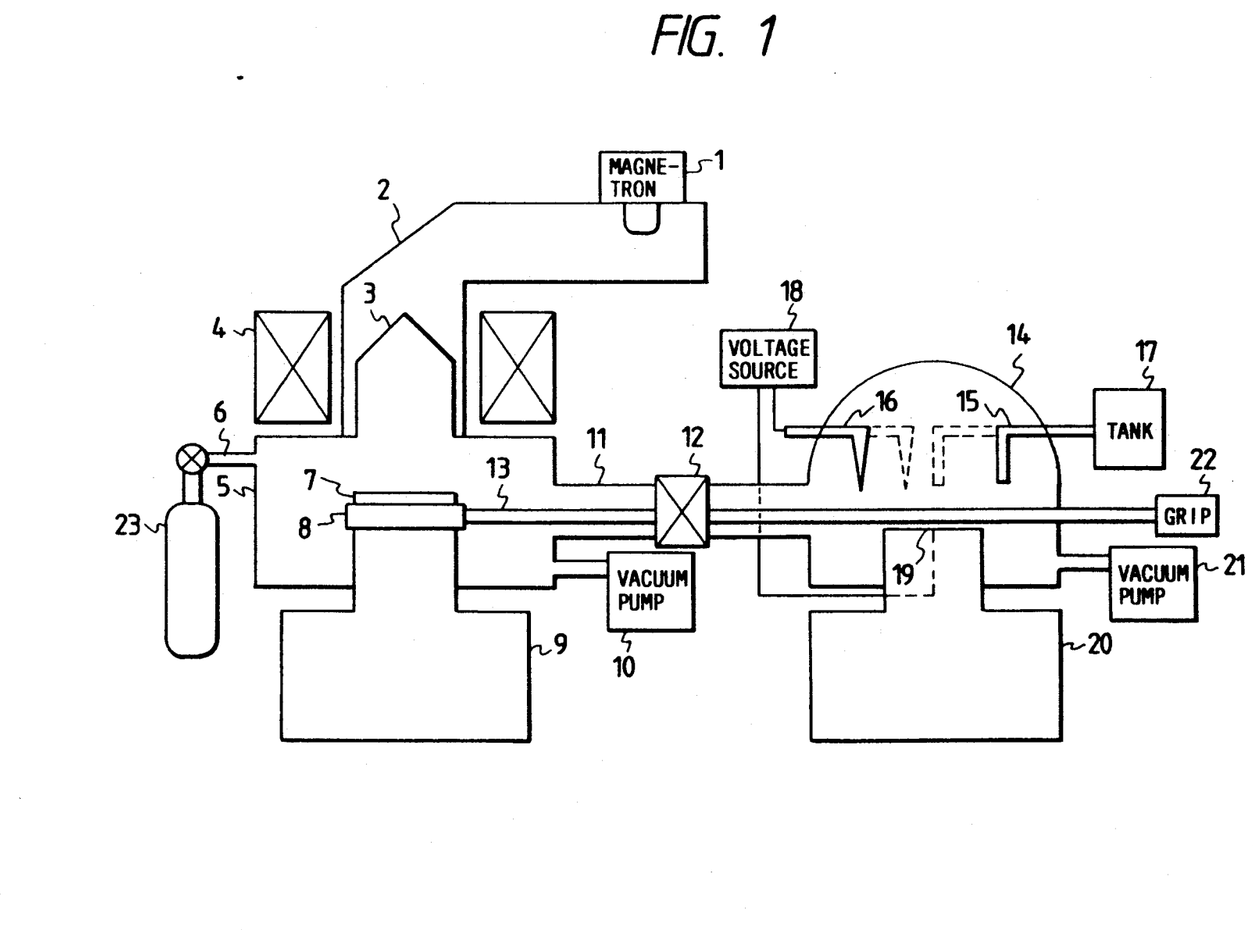
FIG. 1 is a schematic structural view for a surface treatment apparatus as one embodiment according to the present invention.

FIG. 1 illustrates an entire structure of a surface treatment apparatus as one embodiment according to the present invention. The apparatus comprises plasma device for surface treatment, a hole elimination device for eliminating holes induced in an insulator film present on a surface to be treated upon surface treatment by the plasma device and a guide tube for connecting both of the devices.

In this embodiment shown in the drawing, descriptions will be made to a case in which plasmas used for the surface treatment are generated by a magnet-microwave plasma method but, in all of the embodiments including this embodiment, the present invention is not necessarily limited only to the case of applying the surface treatment by using plasmas generated by the magnet-microwave plasma method but the invention is also applicable quite in the same manner to a case of applying the surface treatment using plasmas formed by other plasma generating methods.

In the apparatus of the constitution shown in FIG. 1, a microwave from a magnetron 1 is at first guided through a wave guide tube 2 into a discharge tube 3. A gas used for the surface treatment is discharged from a gas reservoir 23 by way of a gas inlet 6 by a vacuum pump 10 and then introduced into a vacuum vessel (surface treatment chamber) 5, and plasmas are generated by the microwave power introduced in the discharge tube 3. The generated plasmas are collimated into a high density state by the axial magnetic field from a solenoid coil 4. Surface treatment is applied for a sample 7 placed on a sample holder 8 by various particles generated from the plasmas. In this case, the sample 7 and the sample holder 8 can be cooled by a cooler 9.

Figure 2:
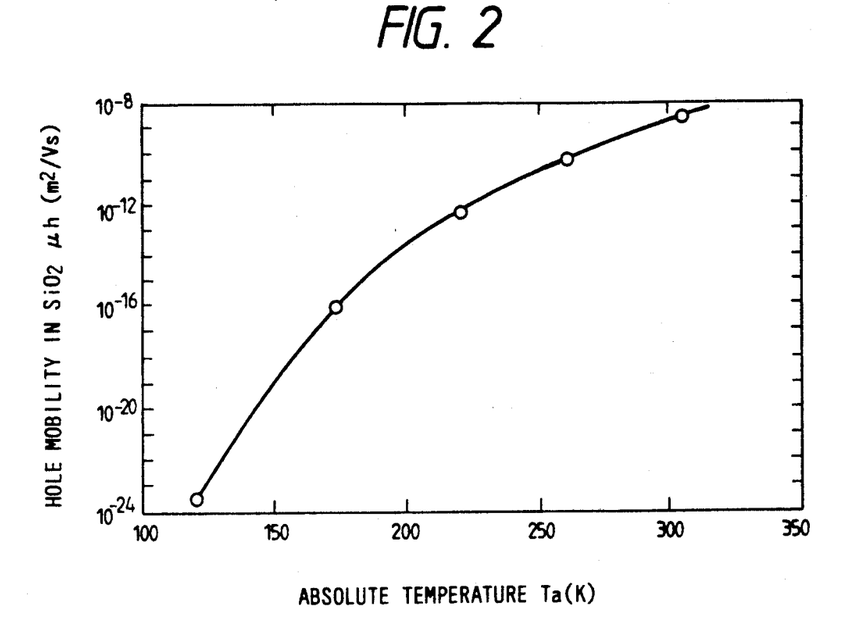
FIG. 2 is a graph illustrating the temperature dependency of the hole mobility in $SiO_2$.

Upon applying the surface treatment by using the plasmas, holes are induced in the insulator film of the sample 7 under the irradiation of the various particles from the plasmas, and FIG. 2 shows the mobility of the thus induced holes in the insulator film ($SiO_2$ film in this case) as a function of the temperature of the sample. The graph was obtained by re-plotting data shown in a literature (R. C. Huges: Appl. Phys. Lett., vol. 26, No. 8 (1975), p 436).

According to the figure, the mobility of the hole in the $SiO_2$ film, for example, at an absolute temperature of 122° K. is $3.3 \times 10^{24}$ $m^2$/Vs and movement of the hole in the $SiO_2$ film of 100 nm thickness takes about $10^{-8}$ sec of time assuming that the surface of the film was charged up to about +10 V. It has been known that the holes are induced by the irradiated particles only at the extreme surface layer of the insulator film. For instance, it has been known that even vacuum ultraviolet rays that penetrate most deeply among various particles generated in the plasmas, form holes at a depth within 10 nm from the surface of the insulator film. That is, if surface treatment is applied while cooling a sample to a temperature of lower than 150° K. and cooling is continued at that temperature after the surface treatment, the induced holes can be kept as they are to the induced position, that is, at the surface layer of the insulator film.

Figure 3:
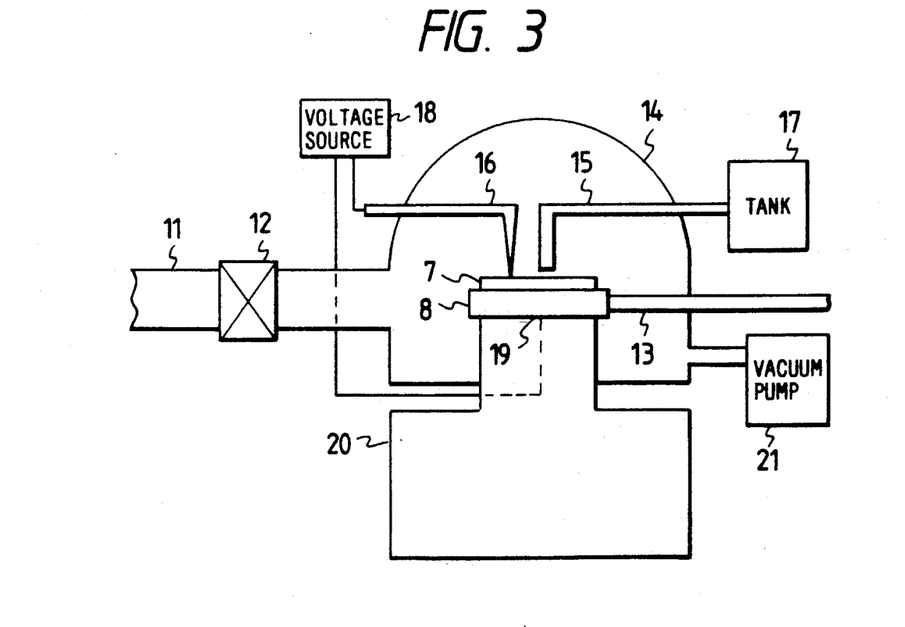
FIG. 3 is a schematic structural view of a portion of an after-treatment device in the surface treatment apparatus as another embodiment according to the present invention.

After the predetermined surface treatment to the sample 7 has been completed in the surface treatment vacuum vessel 5, a valve 12 is opened and the sample 7 completed with the surface treatment is displaced together with the sample holder 8 through a guide tube 11 into a vacuum chamber 14 for after-treatment kept at a predetermined vacuum degree by an evacuation device 21, by using a sample holder displacing rod 13 having a displacing rod handle 22 and then placed on a cooling device 20 (refer to FIG. 3).

In this way, by placing the sample holder 8 and the sample 7 on the cooling device 20, after-treatment for eliminating or neutralizing the holes is conducted while keeping the sample 7 in a state cooled to a low temperature.

At first, a mobile coater 15 having a conductive material coating port is displaced to an appropriate position above the sample 7 and conductive material from a conductive material reservoir 17 is coated on the insulator film of the sample 7. As the conductive material, material containing conductive polymer can be used.

After coating the conductive material, the mobile coater 15 is displaced from above the sample 7 to an appropriate position not in the way for the subsequent treatment. Then, for applying a voltage to the insulator film, a mobile negative electrode 16 is brought into contact with the conductive material coated on the insulator film of the sample 7. In this case, a positive electrode 19 is brought into contact with the lower surface of the sample 7 (on the side of the substrate) from the upper surface of the cooling device 20 by way of the sample holder 8. In this way, a voltage is applied to the insulator film on the sample by the voltage application device 18 such that the potential on the side of the surface of the insulator film is lower than that on the side of the substrate (refer to FIG. 3).

The holes induced in the insulator film are attracted and gathered by the electric field formed in the insulator film by the application of the voltage toward the direction of the surface of the insulator film. In this case, if the cooling power of the cooling devices adjusted is along with the application of the voltage, to properly elevate the temperature of the sample 7, the holes are made more movable and can be gathered easily on the side of the surface of the insulator film.

As described above, when the sample 7 is kept cooled continuously throughout a series of processing stages, i.e., from the required surface treatment step for the semiconductor sample to the step of the voltage application for the elimination of the holes, it is possible to hinder the holes formed at the surface of the insulator film during surface treatment from moving to the interface between the insulator film and the substrate and being trapped at or near the interface. Then, the holes in the insulator film can be collected on the side of the surface of the insulator film and, further, can be drawn and eliminated out of the insulator film by the electric field applied.

EXAMPLE 2

Figure 4:
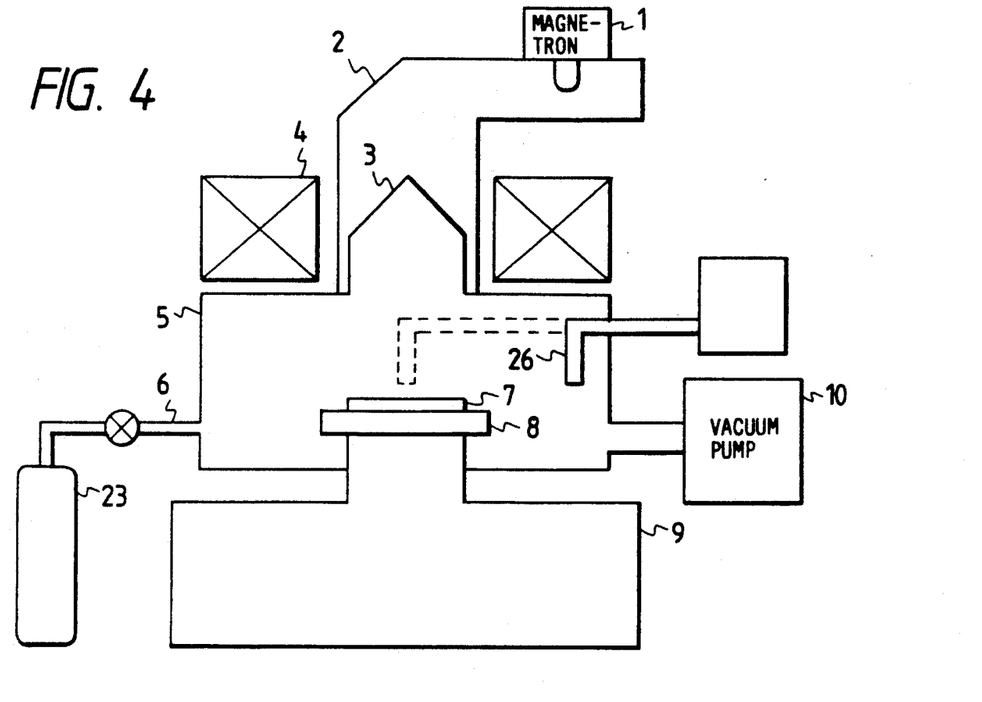
FIG. 4 is a schematic structural view of a surface treatment apparatus as a further embodiment according to the present invention.

Description will then be made to another embodiment of the present invention with reference to FIG. 4.

This embodiment shows a plasma apparatus for surface treatment according to the present invention having a device of depositing negative ions to the surface of the insulator film of a sample application of a required surface treatment.

After applying a required surface treatment in a vacuum vessel 5 while cooling a sample 7 in the same procedures as those in Example 1, a mobile negative ion deposition device 26 is displaced about the insulator film of the sample 7 and negative ions are deposited on the surface of the insulator film. A negative voltage is applied to the surface of the insulator film by negative charges carried by the negative ions and holes induced in the insulator film are eliminated out of the insulator film by the same mechanism as that in the voltage application of Example 1. As negative ions to be deposited to the surface of the insulator film, oxygen ions, nitrogen ions, halogen-containing ions, etc. are appropriate.

EXAMPLE 3

Figure 5:
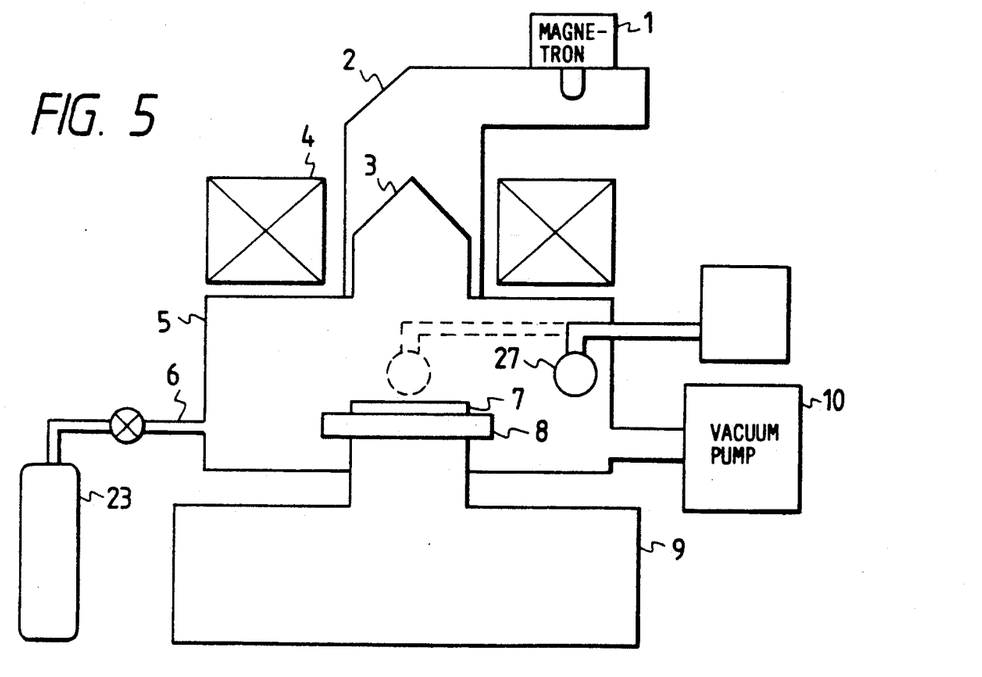
FIG. 5 is a schematic structural view of a surface treatment apparatus as a further embodiment according to the present invention.

Description will next be made to a further embodiment of the present invention with reference to FIG. 5.

This embodiment shows a surface treatment device according to the present invention having a corona discharge apparatus for depositing negative ions to the surface of the insulator film of a sample after application of a required surface treatment.

After applying a required surface treatment while cooling a sample 1 in the same procedures as those in Example 1, a mobile corona discharge device 27 is displaced on an insulator film of the sample 7, and corona discharge is taken place to inject electrons into the insulator film. The electrons injected into the insulator film recombine and neutralized the holes that are induced and stay at the surface layer of the insulator film. If the vacuum vessel 5 is put to an oxygen atmosphere upon corona discharge, ultraviolet rays or vacuum ultraviolet rays generated by the corona discharge are absorbed by oxygen and, accordingly, damage to the sample semiconductor due to the corona discharge itself can be prevented. The holes induced in the insulator film can be neutralized effectively by such mechanism.

EXAMPLE 4

Figure 6:
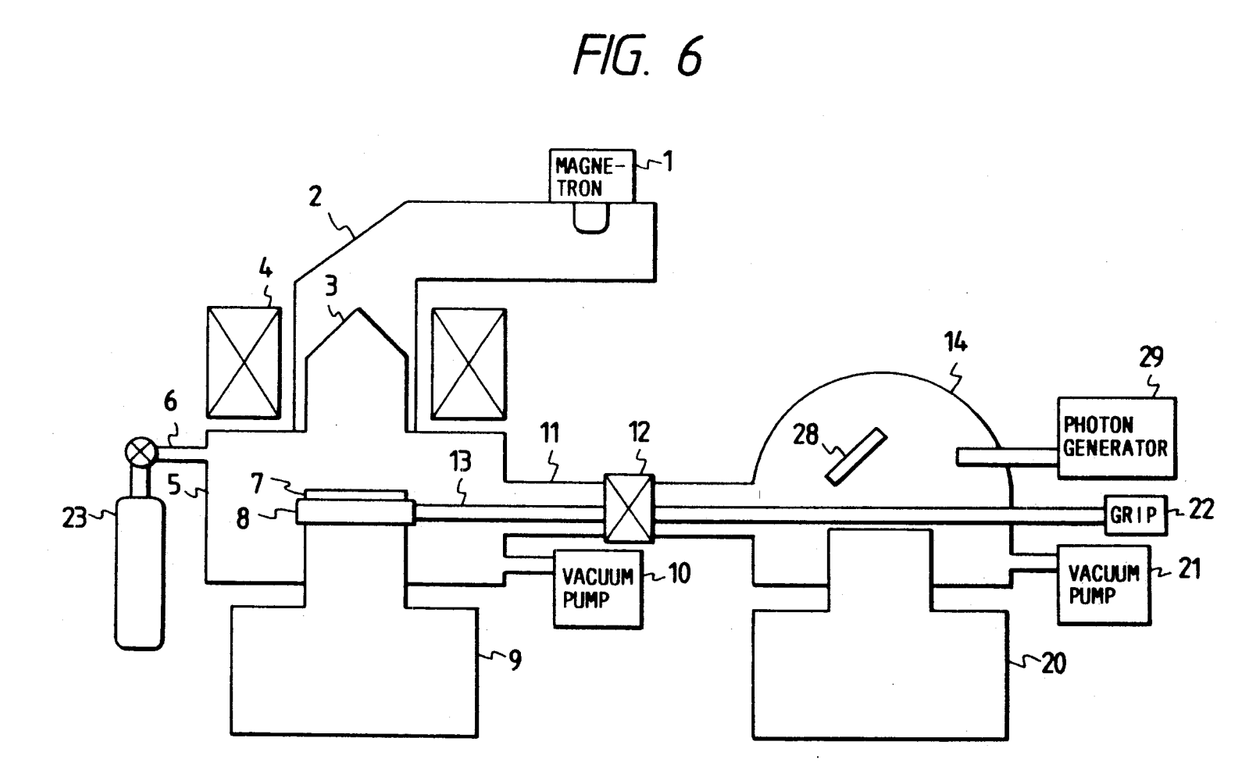
FIG. 6 is a schematic structural view of a surface treatment apparatus as a further embodiment according to the present invention.
Figure 7:
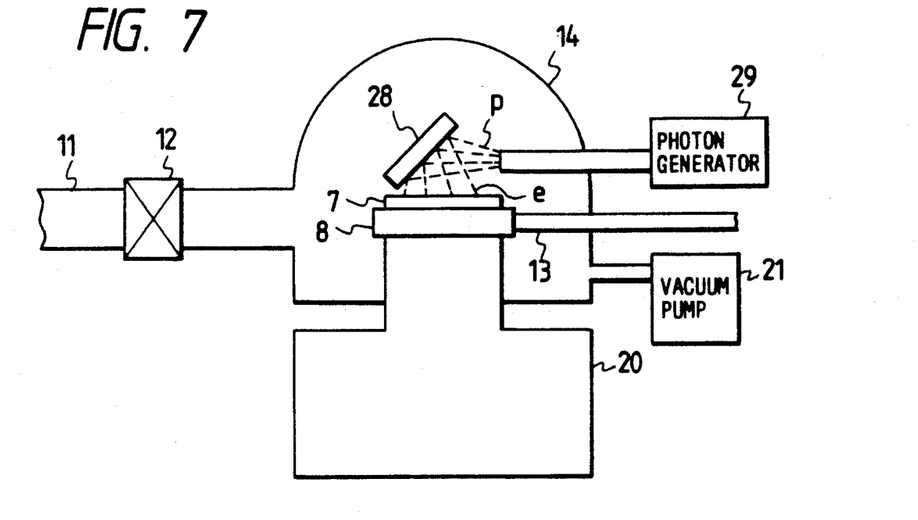
FIG. 7 is a schematic structural view for a portion of the after-treatment device in the surface treatment apparatus shown in FIG. 6.

Description will then be made to a further embodiment of the present invention with reference to FIGS. 6 and 7.

FIG. 6 shows a surface treatment apparatus according to the present invention comprising a plasma device for surface treatment, a device for eliminating holes induced in the insulator film upon surface treatment and a guide pipe for connecting both of the devices.

After applying a required surface treatment while cooling a sample 1 in the same procedures as those in Example 1, a valve 12 is opened and a sample 7 and a sample holder 8 are displaced through a guide pipe 11 into an after-treatment vacuum device 14 kept at a predetermined vacuum degree by an exhaust device 21 by using a sample holder displacing rod 13 having a displacing rod handle 22, and then they are placed on a cooling device 20.

An after-treatment step is applied for neutralizing holes in the insulator film of the sample while cooling the sample 7 on the sample holder 8 placed on the cooling device 20 at a low temperature by the cooling device 20. FIG. 7 shows a state of the device when the after-treatment step is conducted. At first, photons P are generated by a photon generation device 29 and irradiated to a compound semiconductor 28 that emits photoelectrons upon irradiation of photons. Photoelectrons e emitted from the compound semiconductor under the photoelectric effect are injected into the insulator film of the sample 7. The injected photoelectrons neutralize and eliminate the holes in the insulator film in accordance with similar mechanism to that in the electron injection by the corona discharge in Example 3.

EXAMPLE 5

A still further embodiment of the present invention will be described reference to FIG. 8.

Figure 8:
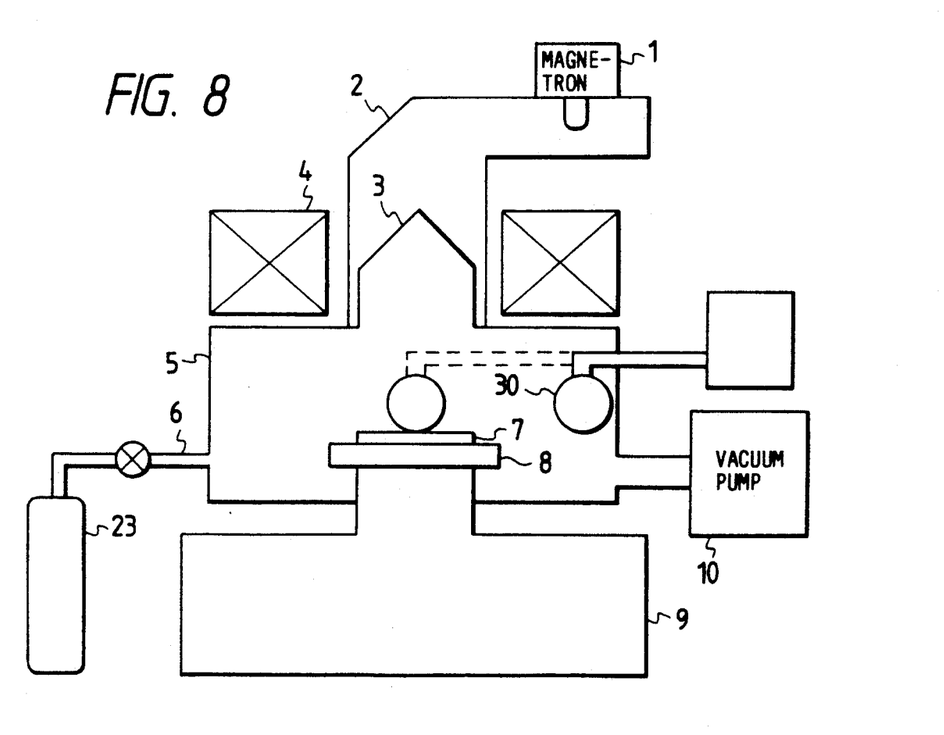
FIG. 8 is a schematic structural view of a surface treatment apparatus as a still further embodiment according to the present invention.

FIG. 8 shows a surface treatment apparatus according to the present invention comprising a static electricity generation device for injecting electrons into an insulator film of a sample after application of a required surface treatment.

After applying a required surface treatment while cooling a sample 1 in the same procedures as those in Example 1, a mobile roller 30 for generating static electricity is displaced onto the insulator film of a sample 7 to generate static charges due the friction between the insulator film and the roller 30. Electrons generated are deposited to the surface of the insulator film to neutralize and eliminate the holes in the insulator film in accordance with the similar mechanism to that the negative ion deposition in Example 2.

EXAMPLE 6

A yet further embodiment according to the present invention will be explained finally with reference to FIG. 9.

Figure 9:
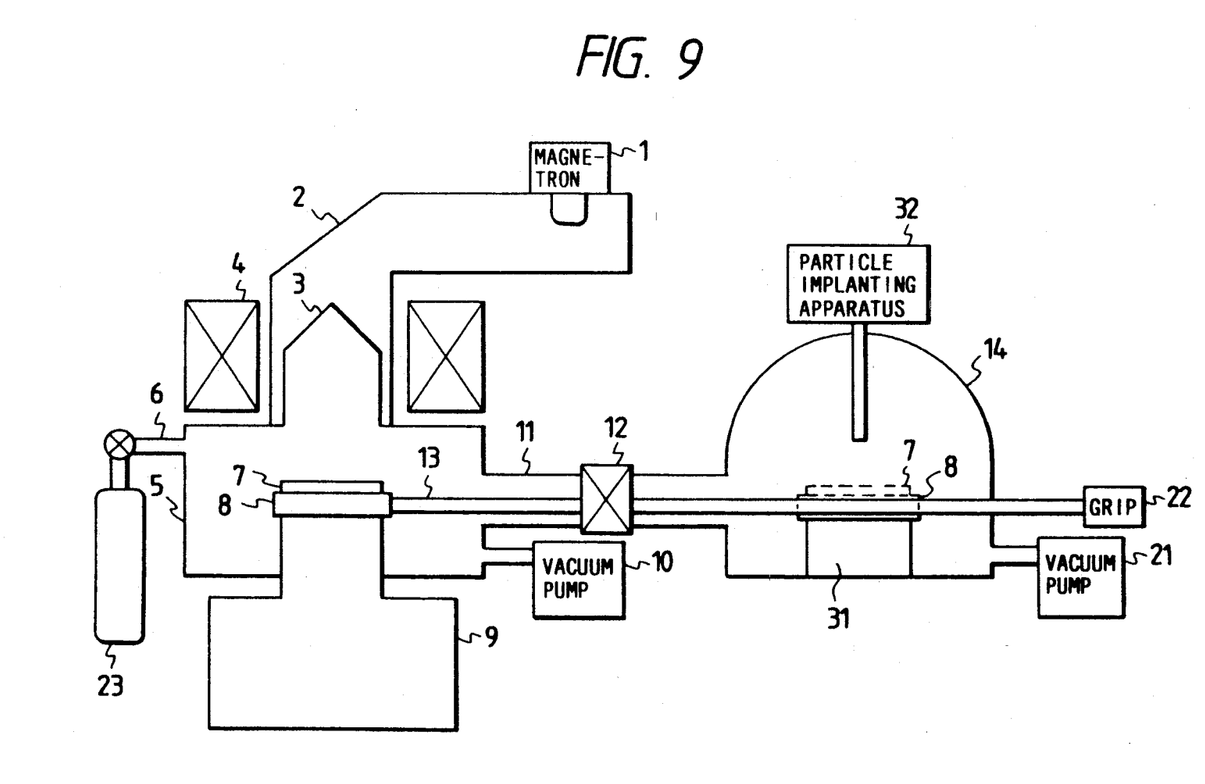
FIG. 9 is a schematic structural view of a surface treatment apparatus as a yet further embodiment according to the present invention.

FIG. 9 shows a surface treatment apparatus according to the present invention comprising a plasma device for surface treatment, a particle implanting device for forming hole trapping level for trapping and immobilizing the holes induced in the insulator film during surface treatment and a guide pipe for connecting both of the devices.

Before applying a required surface treatment to a sample 7 in a vacuum vessel 5 for surface treatment, a sample holder 8 carrying a sample 7 is at first placed on a stand 31 for fixing the sample holder in a vacuum vessel 14 for after-treatment. In this state, low energy particles are implanted into the insulator film of the sample 7 by a particle implanting device 32 for forming the hole trapping level, to form a hole trapping level in the insulator film. As the ions to be implanted into the insulator film, oxygen ions, nitrogen ions, He ions and Ne ions are appropriate.

Subsequently, a valve 12 is opened and the sample 7 and the sample holder 8 are displaced into the vacuum vessel 5 for surface treatment through a guide pipe 11 by using a sample holder displacing rod 13 having a displacing rod handle 12, and they are placed on a cooling device 9 and a required surface treatment is applied to the sample 7 in this state. The procedures for applying the surface treatment are the same as those in Example 1.

Upon applying the surface treatment, since the holes induced in the insulator film of the sample 7 are trapped by the hole trapping level previously formed in the insulator film by the method as described above, it scarcely brings about such an undesirable phenomenon that the holes move into the neighbourhood of or at the interface between the insulator film and become the substrate and trapped there.

According to the present invention, since the holes induced in the insulator film by the surface treatment can be eliminated out of the insulator film, it is possible to prevent the damage of semiconductor caused by the trapping of the holes near or at the interface between the insulator film and the substrate.

Further, according to the present invention, since the holes induced in the insulator film by the surface treatment can be neutralized, it is possible to prevent the damage of semiconductor caused by the trapping of the holes near or at the interface between the insulator film and the substrate.

Furthermore, according to the present invention, since the holes induced in the insulator film during surface treatment can be trapped by the hole trapping level which has been previously formed in the insulator film, it is possible to prevent the damages of semiconductor caused by the trapping of the holes near or at the interface between the insulator film and the substrate.

What is claimed is:

1. A surface treatment method comprising: applying a surface treatment to the surface of a sample containing an insulator film thereby inducing holes in said insulator film by irradiation of various kinds of particles upon surface treatment, and eliminating said holes induced in said insulator film, wherein the sample applied with the surface treatment is kept at a temperature of lower than 150° K.

2. A surface treatment method as defined in claim 1, wherein the insulator film is Si oxide film, Si nitride film or Ta oxide film.

3. A surface treatment method as defined in claim 2, wherein the surface treatment steps comprises a surface treatment using plasmas.

4. A surface treatment method as defined in claim 1, wherein the surface treatment steps comprises a surface treatment using plasmas.

5. A surface treatment method as defined in any one of claims 1, 2, 4 and 3, wherein the step of eliminating the holes comprising applying a voltage such that the potential at the surface of the insulator film on the side irradiated with the various kinds of particles is lower than the potential on the surface of the insulator film on the opposite side.

6. A surface treatment method as defined in claim 5, wherein the step of eliminating the holes comprises depositing conductive material to the surface of the insulator film on the side irradiated with the various kinds of particles and a voltage is applied thereto such that the potential on the surface of the insulator film is lower than that on the surface of the insulator film on the opposite side.

7. A surface treatment method as defined in claim 6, wherein the conductive material comprises material containing a conductive polymer.

8. A surface treatment method as defined in claim 5, wherein the step of eliminating the holes comprises depositing particles charged with negative static charges to the surface of the insulator film on the side irradiated with the various kinds of particles.

9. A surface treatment method as defined in claim 8, wherein the particles charged with static negative charges are negative ions.

10. A surface treatment method as defined in claim 9, wherein the negative ions are any one of oxygen ions, nitrogen ions, and halogen-containing ions.

11. A surface treatment method as defined in claim 5, wherein the voltage is applied by charging the surface of the insulator film on the side irradiated with the various kinds of the particles with static electricity.

12. A surface treatment method comprising: applying a surface treatment to the surface of a sample containing an insulator film thereby inducing holes in said insulator film by the irradiation of various kinds of particles upon surface treatment, and neutralizing said holes induced in said insulator film, wherein the sample applied with the surface treatment is kept at a temperature of lower than 150° K.

13. A surface treatment method as defined in claim 12, wherein the insulator film is Si oxide film, Si nitride film or Ta oxide film.

14. A surface treatment method as defined in claim 13, wherein the surface treatment steps comprises a surface treatment using plasmas.

15. A surface treatment method as defined in claim 12, wherein the surface treatment steps comprises a surface treatment using plasmas.

16. A surface treatment method as defined in any one of claims 12, 13, 15 and 14, wherein the step of neutralizing the holes comprises injecting electrons into the insulator film through the surface of the insulator film on the side irradiated with the various kinds of particles.

17. A surface treatment method as defined in claim 16, wherein the electrons are injected by bringing a material charged to a high negative voltage closer to the surface of the insulator film on the side irradiated with the various kinds of particles from the outer side thereof, thereby causing corona discharge.

18. A surface treatment method as defined in claim 17, wherein the corona discharge is caused in an oxygen atmosphere.

19. A surface treatment method as defined in claim 16, wherein the electrons are injected by disposing a material that generates photoelectrons upon irradiation of photons above the surface of the insulator film on the side irradiated with the various kinds of the particles such that said material is kept from being contact with the surface of said insulator film and injecting photoelectrons generated by irradiating photons onto the material into said insulator film.

20. A surface treatment method as defined in claim 19, wherein the material that generates the photoelectrons is a compound semiconductor.

21. A surface treatment method as defined in claim 20, wherein the semiconductor compound is selected from Ag-O-Cs, Ga-As, Ga-Cs, In-Ga-As, Sb-Cs, Sb-Rb-Cs, Cs-Te or Cs-I.

22. A surface treatment method comprising: applying a surface treatment to the surface of a sample containing an insulator film thereby inducing holes in said insulator film by the irradiation of various kinds of particles upon surface treatment, and retaining said holes induced in said insulator film immovably in said insulator film such that they do not move to the surface on the side opposite to the surface of the insulator film on which the various kinds of particles are irradiated, wherein the sample applied with the surface treatment is kept at a temperature of lower than 150° K.

23. A surface treatment method as defined in claim 22, wherein the insulator film is Si oxide film, Si nitride film or Ta oxide film.

24. A surface treatment method as defined in claim 23, wherein the surface treatment steps comprises a surface treatment using plasmas.

25. A surface treatment method as defined in claim 22, wherein the surface treatment steps comprises a surface treatment using plasmas.

26. A surface treatment method as defined in any one of claims 22, 23, 25 and 24, wherein the step of retaining the holes immovabeably comprises trapping the holes to the hole trapping centers previously formed in the insulator film.

27. A surface treatment method as defined in claim 26, wherein the surface trapping centers are formed by inplanting ions in the insulator film.

28. A surface treatment method as defined in claim 27, wherein the hole trapping centers are formed only near the surface of the insulator film on the side irradiated with the various kinds of particles during surface treatment, by implanting ions at an energy level of lower than 1 KeV.

29. A surface treatment method as defined in claim 28, wherein the implanted ions are selected from oxygen ions, nitrogen ions, He ions or Ne ions.

30. A surface treatment method as defined in claim 28, wherein neutral atoms or molecules at an energy of lower than 10 KeV are implanted instead of the ions at an energy of lower than 1 KeV.

31. A surface treatment apparatus comprising a vacuum vessel for forming a surface treatment chamber; a gas introducing equipment for introducing a gas used for the surface treatment into said vacuum vessel; an evacuating equipment for reducing the pressure and evacuating the inside of the vessel; a mechanism for generating particles used for the surface treatment, wherein holes are induced in an insulator film of a sample applied with the surface treatment; means for cooling the sample applied with the surface treatment to lower than 150° K.; and means for eliminating said holes.

32. A surface treatment apparatus as defined in claim 31, wherein the sample to be applied with the surface treatment is a sample comprising an insulator film containing Si or Ta.

33. A surface treatment apparatus as defined in claim 32, wherein the mechanism for generating particles used for the surface treatment is a plasma generating device.

34. A surface treatment apparatus as defined in claim 31, wherein the mechanism for generating particles used for the surface treatment is a plasma generating device.

35. A surface treatment as defined in any of claims 31, 32, 34 or 33, wherein means for eliminating the holes induced in the insulator film of the sample applied with the surface treatment comprises a mechanism for applying a voltage such that the potential on the surface of the insulator film on the side irradiated with the particles used for the surface treatment is lower than the potential on the surface of the insulator film on the opposite side.

36. A surface treatment apparatus as defined in claim 35, wherein the voltage application mechanism comprises means for coating conductive material to the surface of the sample and means for applying a voltage to said conductive material and, further, means for displacing the resist coating means and said voltage application means to such positions as not hindering the surface treatment during application of the surface treatment is additionally disposed.

37. A surface treatment apparatus as defined in claim 36, wherein the conductive material to be coated comprises a material containing a conductive polymer.

38. A surface treatment apparatus as defined in claim 35, wherein the voltage application mechanism comprises means for depositing negatively charged particles to the surface of the insulator of the sample.

39. A surface treatment apparatus as defined in claim 38, wherein the means for depositing the negatively charged particles to the surface of the insulator film of the sample comprises means for depositing negative ions to the surface of the insulator film of the sample.

40. A surface treatment apparatus as defined in claim 39, the negative ions are selected from oxygen ions, nitrogen ions or halogen-containing ions.

41. A surface treatment apparatus comprising a vacuum vessel for forming a surface treatment chamber; a gas introducing equipment for introducing a gas used for the surface treatment into said vacuum vessel; an evacuating equipment for reducing the pressure and evacuating the inside of the vessel; a mechanism for generating particles used for the surface treatment, wherein holes are induced in an insulator film of a sample applied with the surface treatment; means for cooling the sample applied with the surface treatment to lower than 150° K.; and means for neutralizing said holes.

42. A surface treatment apparatus as defined in claim 41, wherein the sample to be applied with the surface treatment is a sample comprising an insulator film containing Si or Ta.

43. A surface treatment apparatus as defined in claim 42, wherein the mechanism for generating particles used for the surface treatment is a plasma generating device.

44. A surface treatment apparatus as defined in claim 41, wherein the mechanism for generating particles used for the surface treatment is a plasma generating device.

45. A surface treatment apparatus as defined in any one of claims 41, 42, 44 or 43, wherein means for neutralizing the holes induced in the insulator film of the sample applied with the surface treatment comprises a mechanism for injecting electrons into the insulator film through the surface of the insulator film on the side irradiated with the particles used for the surface treatment.

46. A surface treatment apparatus as defined in claim 45, wherein the mechanism for injecting the electrons comprises means for causing corona discharge at a position in the vicinity of but kept from being contact with the surface of the sample, and means for displacing said corona discharge causing means to such a position as not hindering the surface treatment during application of the surface treatment.

47. A surface treatment apparatus as defined in claim 46, wherein means for further introducing an oxygen gas is additionally disposed.

48. A surface treatment apparatus as defined in claim 45, wherein the mechanism for injecting the electrons comprises means for generating photoelectrons disposed above the surface of the sample so as not to be in contact with the surface of said sample, and means for displacing said photoelectron generation means to a position not hindering the surface treatment during application of the surface treatment.

49. A surface treatment apparatus as defined in claim 48, wherein the material for generating the photoelectrons is a compound semiconductor.

50. A surface treatment method as defined in claim 49, wherein the semiconductor compound for generating the photoelectrons is selected from Ag-O-Cs, Ga-As, Ga-Cs, In-Ga-As, Sb-Cs, Sb-Rb-Cs, Cs-Te or Cs-I.

51. A surface treatment apparatus as defined in claim 45, wherein the mechanism for injecting the electrons comprises means for generating static electricity at the surface of the sample and means for displacing said static electricity generation means to such a position as not hindering the surface treatment during application of the surface treatment is additionally incorporated.

52. A surface treatment apparatus comprising a vacuum vessel for forming a surface treatment chamber; a gas introducing equipment for introducing a gas used for the surface treatment into said vacuum vessel; an evacuating equipment for reducing the pressure and evacuating the inside of the vessel; a mechanism for generating particles used for the surface treatment, wherein holes are induced in an insulator film of a sample applied with the surface treatment; means for cooling the sample applied with the surface treatment to lower than 150° K.; and means for providing a region in said insulator film for retaining said holes immovably in said insulator film such that they do not move to the surface of the insulator film on the side opposite to that irradiated with the particles for the surface treatment.

53. A surface treatment apparatus as defined in claim 52, wherein the sample to be applied with the surface treatment is a sample comprising an insulator film containing Si or Ta.

54. A surface treatment apparatus as defined in claim 53, wherein the mechanism for generating particles used for the surface treatment is a plasma generating device.

55. A surface treatment apparatus as defined in claim 34, wherein the mechanism for generating particles used for the surface treatment is a plasma generating device.

56. A surface treatment apparatus as defined in any one of claims 52, 53, 55 or 54, wherein means for providing a region in said insulator film for retaining said holes immovably in the insulator film such that they do not move to the surface of said insulator film on the side opposite to that irradiated with the particles used for the surface treatment comprises means for forming hole tracking centers in said insulator film.

57. A surface treatment apparatus as defined in claim 56, wherein the means for forming the hole trapping centers in the insulator film comprises means for irradiating ions or neutral particles to the surface of the same.

58. A surface treatment apparatus as defined in claim 57, wherein the energy of the ions irradiated to the sample for forming the hole trapping centers is lower than 1 KeV.

59. A surface treatment apparatus as defined in claim 58, wherein the ions to be irradiated to the sample for forming the hole trapping centers are selected from oxygen ions, nitrogen ions, He ions or Ni ions.

60. A surface treatment apparatus as defined in claim 57, wherein the energy of the neutral particles that irradiate the sample for forming the hole trapping centers is lower than 10 KeV.

61. A surface treatment method comprising:
irradiating a sample comprising a substrate having an insulator film on its upper surface with charged particles to effect surface treatment, thereby inducing holes in said insulator film;
cooling said sample during and after said irradiating to a temperature at which a mobility of said holes in said insulator film is reduced;
eliminating or neutralizing said holes induced in said insulator film prior to said holes moving to an interface between said insulator film and said substrate.

62. A surface treatment apparatus as defined in claim 61, wherein said temperature is less than 150° K.

63. A surface treatment apparatus as defined in claim 61, wherein said holes are eliminated by applying a voltage to said insulator film such that a potential of an upper surface of said insulator film is lower than that of said interface.

64. A surface treatment apparatus as defined in claim 61, wherein said holes are neutralized by injecting electrons into an upper surface of said insulator film after the step of irradiating.

65. A surface treatment method comprising:
implanting low energy particles into an upper surface of an insulator film provided on a substrate, thereby forming trapping centers for holes near said upper surface;
irradiating a sample comprising a substrate having an insulator film on its upper surface with charged particles to effect surface treatment, thereby inducing holes in said insulator film;
cooling said sample during and after said irradiating to a temperature at which a mobility of said holes in said insulator film is reduced;
whereby said holes are trapped at said trapping centers to prevent said holes from moving to an interface of said insulator film and said substrate.

66. A surface treatment method as defined in claim 65, wherein said temperature is less than 150° K.

67. A surface treatment apparatus as defined in claim 65, wherein said low energy particles are ions having energy less than 1 keV.

68. A surface treatment method as defined in claim 65, wherein said low energy particles are neutral atoms or molecules having an energy less than 10 keV.

* * * * *